United States Patent [19]

Kaufman

[11] Patent Number: 4,879,633

[45] Date of Patent: Nov. 7, 1989

[54] DIRECT BOND CIRCUIT ASSEMBLY WITH GROUND PLANE

[76] Inventor: Lance R. Kaufman, 131 N. White Oak Way, Mequon, Wis. 53092

[21] Appl. No.: 180,474

[22] Filed: Apr. 12, 1988

[51] Int. Cl.$^4$ .............................................. H05K 7/20
[52] U.S. Cl. ..................................... 361/386; 29/843; 357/70; 357/81; 361/406; 361/421
[58] Field of Search .............................. 165/80.3, 185; 174/16 HS, 52 FP; 357/70, 81; 361/386–389, 392–396, 406, 421; 228/188; 29/832, 842, 843, 846

[56] References Cited

U.S. PATENT DOCUMENTS

| | | |
|---|---|---|
| 3,744,120 | 7/1973 | Burgess et al. |
| 3,766,634 | 10/1973 | Babcock et al. |
| 3,854,892 | 12/1974 | Burgess et al. |
| 3,911,553 | 10/1975 | Burgess et al. |
| 3,958,075 | 5/1976 | Kaufman |
| 3,993,411 | 11/1976 | Babcock et al. |
| 3,994,430 | 11/1976 | Cusano et al. |
| 4,129,243 | 12/1978 | Cusano et al. |
| 4,156,148 | 5/1979 | Kaufman |
| 4,158,745 | 6/1979 | Keller ................................. 357/70 |
| 4,196,411 | 4/1980 | Kaufman |
| 4,215,235 | 7/1980 | Kaufman |
| 4,218,724 | 8/1980 | Kaufman |
| 4,250,481 | 2/1981 | Kaufman |
| 4,266,140 | 5/1981 | Kaufman |
| 4,394,530 | 7/1983 | Kaufman |
| 4,449,165 | 5/1984 | Kaufman |
| 4,449,292 | 5/1984 | Kaufman |
| 4,488,202 | 12/1984 | Kaufman |
| 4,498,120 | 2/1985 | Kaufman |
| 4,530,003 | 7/1985 | Blair ................................... 357/81 |
| 4,546,410 | 10/1985 | Kaufman |
| 4,546,411 | 10/1985 | Kaufman |
| 4,554,613 | 11/1985 | Kaufman |
| 4,574,162 | 3/1986 | Kaufman |
| 4,577,387 | 3/1986 | Kaufman |
| 4,630,174 | 12/1986 | Kaufman |
| 4,700,273 | 10/1987 | Kaufman |
| 4,713,723 | 12/1987 | Kaufman |
| 4,724,514 | 2/1988 | Kaufman |

OTHER PUBLICATIONS

"Over 50 years of experience with the Direct Bond Copper process.", Tegmen Corp., 1201 East Fayette Street, Syracuse, New York 13210.

Primary Examiner—A. D. Pellinen
Assistant Examiner—Gregory D. Thompson
Attorney, Agent, or Firm—Andrus, Sceales, Starke & Sawall

[57] ABSTRACT

An electric circuit assembly (10) is provided by a ceramic base substrate (14), a copper ground plane (20) directly bonded to the base substrate, an intermediate ceramic substrate (22) directly bonded to the ground plane, and a copper lead frame (24) having a pad portion (26) directly bonded to the intermediate substrate. The base substrate extends laterally beyond the ground plane and intermediate substrate. The lead frame has an extension portion (32) extending laterally beyond the intermediate substrate, ground plane and base substrate, and spaced above the base substrate by the thickness of the ground plane and intermediate substrate. The lead frame extension portion is bent upwardly from the pad portion along a bend line spaced laterally inwardly of the outer edge (18) of the base substrate.

6 Claims, 1 Drawing Sheet

DIRECT BOND CIRCUIT ASSEMBLY WITH GROUND PLANE

BACKGROUND AND SUMMARY

The invention relates to a direct bond electric circuit assembly, and more particularly to an improved assembly structure and manufacturing method in combination.

Electric circuit assemblies in the field of the present invention typically include an electrically insulating thermally conductive non-metallic refractory substrate, e.g. ceramic, having electrically conductive metallic lead frames, e.g. copper, mounted on top of the substrate, and electrical components, e.g. semiconductor chips, mounted on the lead frames. The structure is covered by an insulating housing which in turn is mounted to a heat sink such that the bottom surface of the ceramic substrate is in intimate contact with the heat sink. Examples of such circuit assemblies are shown in U.S. Pat. Nos. 3,958,075, 4,156,148, 4,196,411, 4,215,235, 4,218,724, 4,250,481, 4,266,140, 4,394,530, 4,449,165, 4,449,292, 4,488,202, 4,498,120, 4,546,410, 4,546,411, 4,554,613, 4,574,162, 4,577,387, 4,630,174, 4,700,273, 4,713,723, 4,724,514.

The copper lead frames are mounted to the ceramic in various manners, for example by a solder reflow operation, or by a direct bond operation, both of which processes are known in the art.

Direct bonding of the copper to the ceramic involves placing the lead frame in contact with the ceramic, heating the lead frame and the ceramic substrate to a temperature below the melting point of the lead frame to form a eutectic with the lead frame which wets the lead frame and the ceramic substrate, and cooling the lead frame and the substrate, with the lead frame bonded to the substrate. The lead frame is pre-oxidized, and the heating is done in an inert atmosphere to form the eutectic, or alternatively the heating is done in a reactive oxygen gas atmosphere to form the eutectic. Direct bond processing is disclosed in U.S. Pat. Nos. 3,744,120, 3,766,634, 3,854,892, 3,911,553, 3,993,411, 3,994,430, 4,129,243. Further reference may be had to "Over 50 years of experience with the Direct Bond Copper process", Tegmen Corp., 1201 East Fayette Street, Syracuse, N.Y.

In various circuit assemblies, the lead frame has a pad portion bonded to the substrate, and an extension portion bent upwardly from the pad portion to extend through the housing cover. The upwardly bent extension portion is spaced laterally inwardly of the outer edge of the substrate. A lower shoulder of the cover housing engages the top of the substrate adjacent the edge and clamps the substrate into engagement with the heat sink therebelow, for example as shown in U.S. Pat. Nos. 4,218,724 at FIG. 6, 4,394,530 at FIG. 4, 4,449,165 at FIG. 2, 4,546,410 at FIG. 3. In these types of structures, the lead frame extension portion should not be allowed to bond to the substrate because this will prevent bending of the lead frame at a bend line spaced inwardly of the outer edge of the substrate. In prior solder reflow type bonding operations, solder is merely deleted from beneath the lead frame extension over the substrate to thus prevent such bond. In direct bonding operations, however, the entire copper lead frame is subject to formation of the eutectic upon heating, and hence the entire portion of the lead frame in contact with the ceramic substrate will bond thereto. When attempting to bend the lead frame upwardly at a bend line spaced laterally inwardly of the outer edge of the substrate, it has been found that the substrate usually breaks or shatters at such bend line due to the bond to the lead frame extension portion thereon.

The present invention addresses and solves the noted problem in a particularly simple and effective manner, and also provides a ground plane in combination. Another solution to the noted problem is the subject of co-pending application Ser. No. 180,541, filed on even date herewith, entitled "DIRECT BOND CIRCUIT ASSEMBLY WITH CRIMPED LEAD FRAME", to which cross reference is made.

DETAILED DESCRIPTION

Figure 1:
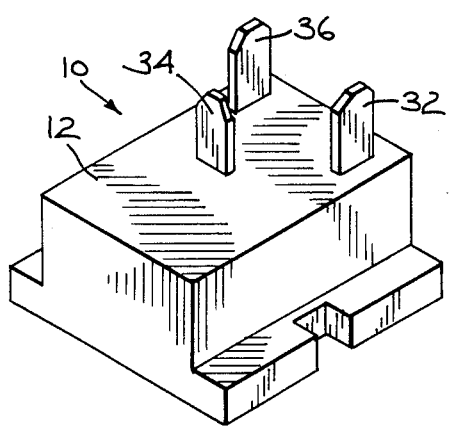
FIG. 1 is a perspective assembled view of an electric circuit assembly in accordance with the invention.
Figure 2:
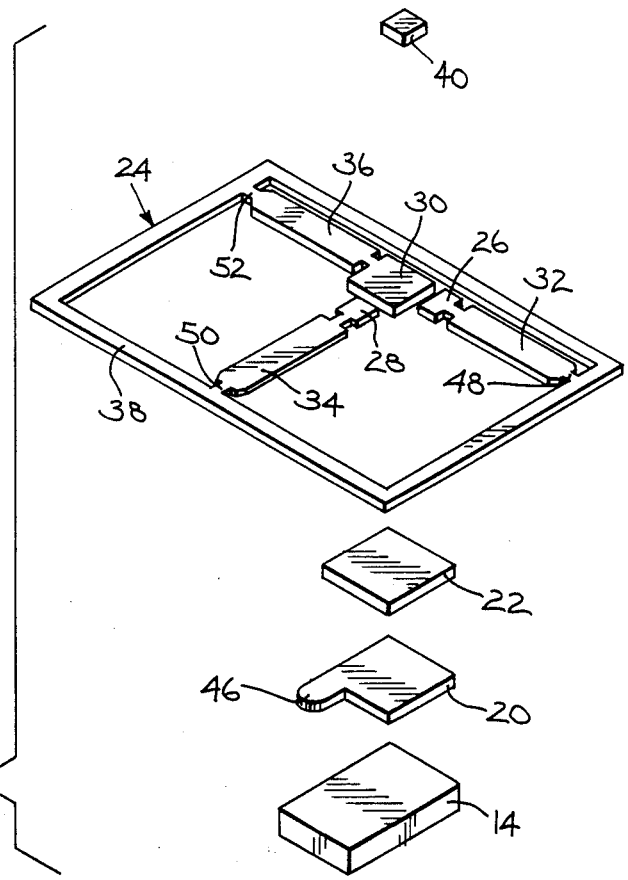
FIG. 2 is an exploded perspective preassembly view of the circuit assembly of FIG. 1, absent the housing cover.
Figure 4:
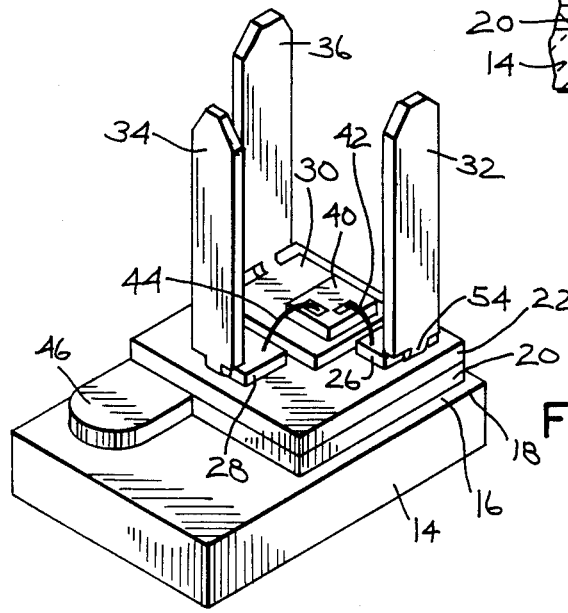
FIG. 4 is a perspective assembled view of the circuit assembly of FIG. 1, absent the housing cover.

FIG. 1 shows an electric circuit assembly 10 including a thermo-plastic housing cover 12 clamped against a heat sink therebelow (not shown), for which further reference may be had to the above noted circuit assembly patents, incorporated herein by reference. The circuit assembly includes an electrically insulating thermally conductive base substrate 14, preferably ceramic, FIGS. 2 and 4. A lower inner shoulder of housing cover 12 engages the top 16 of substrate 14 adjacent outer edge 18 to clamp substrate 14 into engagement with the heat sink therebelow, as in the above noted patents.

An electrically conductive metallic ground plane 20, preferably copper, is placed on base substrate 14. An electrically insulating thermally conductive intermediate substrate 22, preferably ceramic, is placed on ground plane 20. Base substrate 14 extends laterally beyond ground plane 20 and intermediate substrate 22. An electrically conductive metallic lead frame stamping 24, preferably copper, has pad portions 26, 28, 30 placed on intermediate substrate 22, and respective extension portions 32, 34, 36 extending laterally beyond ground plane 20 and intermediate substrate 22 and laterally beyond base substrate 14. The lead frame pad portions and extension portions are held in an outer perimeter frame 38.

Ground plane 20 is directly bonded to base substrate 14, and intermediate substrate 22 is directly bonded to ground plane 20, and lead frame pad portions 26, 28, 30 are directly bonded to intermediate substrate 22, by heating substrate 14, ground plane 20, substrate 22 and lead frame 24 to a temperature below the melting point of copper ground plane 20 and copper lead frame 24 to form a eutectic with copper ground plane 20 and copper lead frame 24, which wets ceramic substrate 14, copper ground plane 20, ceramic substrate 22 and copper lead frame 24, and cooling substrate 14, ground plane 20, substrate 22 and lead frame 24, with copper ground plane 20 bonded to ceramic substrate 14 therebelow and ceramic substrate 22 thereabove, and copper lead frame pad portions 26, 28, 30 bonded to ceramic substrate 22 therebelow, for which further reference may be had to the direct bond process patents noted above, incorporated herein by reference. Ground plane 20 and lead frame 24 are pre-oxidized, and the heating is done in an inert atmosphere. Alternatively, the heating is done in a reactive oxygen gas atmosphere. The electrical components are then mounted on the lead frame pad portions in the desired circuit implementation, for example FET 40 is mounted on lead frame pad portion 30 as the drain by a solder reflow operation, and jumper wires 42 and 44 provide respective source and gate terminal connections to pad portions 26 and 28. Ground plane 20 includes tongue 46 for circuit connection as desired, or tongue 46 may be omitted if ground plane 20 is not electrically functional, but merely used for structural spacer purposes, to be described. Lead frame 24 is then cut at nibs 48, 50, 52, and outer perimeter 38 is removed. Lead frame extension portions 32, 34, 36 are then bent upwardly, resulting in the circuit assembly shown in FIG. 4.

Figure 3:
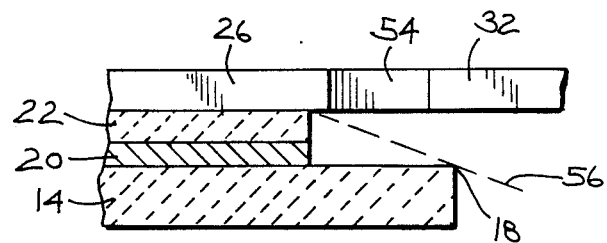
FIG. 3 is a sectional assembled view of a portion of the circuit assembly of FIG. 2.

As shown in FIG. 3, lead frame extension portion 32 is spaced above base substrate 14 by the thickness of ground plane 20 and intermediate substrate 22. This prevents bonding of copper lead frame extension portion 32 to ceramic substrate 14, which in turn facilitates upward bending of the lead frame extension portion such that lead frame extension portion 32 extends upwardly from pad portion 26, FIG. 4, and is spaced laterally inwardly of outer edge 18 of base substrate 14. The lead frame extension portion is bent at a bend line along a reduced width section 54. The other lead frame extension portions are likewise bent upwardly along a bend line spaced laterally inwardly of the outer edge of base substrate 14, and are spaced above substrate 14 to facilitate such bending.

During the noted direct bonding operation, lead frame extension portion 32 may sag slightly, as shown at dashed line 56 in FIG. 3, such that the lead frame extension portion touches the outer edge 18 of base substrate 14 and directly bonds thereto at a point contact or tack bond. This point contact tack bond is readily broken, to facilitate upward bending of lead frame extension portion 32 such that lead frame extension portion 32 extends upwardly from pad portion 26 and is still laterally inward of outer edge 18 of base substrate 14.

It is recognized that various equivalents, alternatives and modifications are possible within the scope of the appended claims.

I claim:

1. An electric circuit assembly comprising:
   an electrically insulating thermally conductive base substrate;
   an electrically conductive metallic ground plane on said base substrate;
   an electrically insulating thermally conductive intermediate substrate on said ground plane;
   said base substrate extending laterally beyond said ground plane and said intermediate substrate;
   an electrically conductive metallic lead frame having a pad portion on said intermediate substrate and having an extension portion extending laterally beyond said ground plane and intermediate substrate;
   said ground plane being directly bonded to said base substrate, said intermediate substrate being directly bonded to said ground plane, said lead frame pad portion being directly bonded to said intermediate substrate, all by heating said base substrate, said ground plane, said intermediate substrate and said lead frame to a temperature below the melting point of said ground plane and said lead frame to form a eutectic with said ground plane and said lead frame which wets said base substrate, said ground plane, said intermediate substrate and said lead frame, and cooling said base substrate, said ground plane, said intermediate substrate and said lead frame, with said ground plane bonded to said base substrate therebelow and said intermediate substrate thereabove, and said lead frame pad portion bonded to said intermediate substrate therebelow.

2. The electric circuit assembly according to claim 1 wherein said lead frame extension portion is spaced above said base substrate to prevent bonding thereto, to facilitate upward bending of said lead frame extension, such that said lead frame extension extends upwardly from said pad portion and is spaced laterally inwardly of the outer of said base substrate.

3. The electric circuit assembly according to claim 1 wherein said lead frame extension portion is spaced above said base substrate and sags slightly during said direct bonding of said base substrate, said ground plane, said intermediate substrate and said lead frame pad portion, such that said lead frame extension portion touches the outer edge of said base substrate and directly bonds thereto, at a point contact which is readily broken, to facilitate upward bending of said lead frame extension portion, such that said lead frame extension portion extends upwardly from said pad portion and is spaced laterally inwardly of the outer edge of said base substrate.

4. A method for making an electric circuit assembly comprising:
   providing an electrically insulating thermally conductive non-metallic refractory base substrate;
   providing an electrically conductive metallic ground plane and placing said ground plane on said base substrate such that said base substrate extends laterally beyond said ground plane;
   providing an electrically insulating thermally conductive non-metallic refractory intermediate substrate and placing said intermediate substrate on said ground plane such that said base substrate extends laterally beyond said intermediate substrate;
   providing an electrically conductive metallic lead frame having a pad portion and an extension portion, and placing said lead frame pad portion on said intermediate substrate such that said lead frame extension portion extends laterally beyond said intermediate substrate and said ground plane;
   directly bonding said lead frame pad portion to said intermediate substrate, and said intermediate substrate to said ground plane, and said ground plane to said base substrate, by heating said base substrate, said ground plane, said intermediate substrate and said lead frame to a temperature below the melting point of said lead frame and said ground plane to form a eutectic with said lead frame and said ground plane, which wets said base substrate, said ground plane, said intermediate substrate and said lead frame, and cooling said base substrate, said ground plane, said intermediate substrate and said lead frame, with said ground plane bonded to said base substrate therebelow and to said intermediate substrate thereabove, and with said lead frame pad portion bonded to said intermediate substrate therebelow.

5. The method for making an electric circuit assembly according to claim 4 wherein said lead frame pad portion and extension portion are spaced above said base substrate by the thickness of said ground plane and said intermediate substrate to prevent direct bonding of said lead frame extension portion to said base substrate, and comprising bending said lead frame extension portion upwardly from said lead frame pad portion.

6. The method for making an electric circuit assembly according to claim 4 wherein said lead frame pad portion and extension portion are spaced above said base substrate by the thickness of said ground plane and said intermediate substrate, and wherein said lead frame extension portion sags slightly during said direct bonding step to touch said base substrate and tack bond thereto, which tack bond is readily broken, and comprising breaking said tack bond and bending said lead frame extension portion upwardly from said lead frame pad portion.

* * * * *